(12) United States Patent
Kawamoto

(10) Patent No.: US 7,514,781 B2
(45) Date of Patent: Apr. 7, 2009

(54) CIRCUIT SUBSTRATE AND MANUFACTURING METHOD THEREOF

(75) Inventor: Satoru Kawamoto, Chita-gun (JP)

(73) Assignee: DENSO CORPORATION, Kariya (JP)

( * ) Notice: Subject to any disclaimer, the term of this patent is extended or adjusted under 35 U.S.C. 154(b) by 12 days.

(21) Appl. No.: 11/602,230

(22) Filed: Nov. 21, 2006

(65) Prior Publication Data

US 2007/0120249 A1    May 31, 2007

(30) Foreign Application Priority Data

Nov. 25, 2005    (JP) .............................. 2005-340773

(51) Int. Cl.
*H01L 23/14*    (2006.01)
(52) U.S. Cl. .................. 257/702; 257/701; 257/712; 257/713; 257/758; 257/774; 257/E25.062; 257/E23.067; 174/250; 174/255; 174/258; 428/209
(58) Field of Classification Search ............. 257/701, 257/702, 712, 713, 758, 774, E23.062, E23.067; 174/250, 255, 258; 428/209
See application file for complete search history.

(56) References Cited

U.S. PATENT DOCUMENTS

| | | | |
|---|---|---|---|
| 6,184,577 B1 * | 2/2001 | Takemura et al. ........... | 257/701 |
| 6,488,869 B2 * | 12/2002 | Takezawa et al. ........... | 252/513 |
| 6,657,295 B2 | 12/2003 | Araki | |
| 6,846,549 B2 * | 1/2005 | Tani et al. ................... | 428/209 |
| 6,869,665 B2 * | 3/2005 | Tani et al. ................... | 428/209 |
| 7,002,080 B2 * | 2/2006 | Tani et al. ................... | 174/258 |
| 7,279,771 B2 * | 10/2007 | Sunohara et al. ............ | 257/516 |
| 2002/0182958 A1 * | 12/2002 | Tani et al. ................... | 442/180 |

FOREIGN PATENT DOCUMENTS

| | | |
|---|---|---|
| JP | A-10-303556 | 11/1998 |
| JP | A-11-008459 | 1/1999 |
| JP | A-2001-036253 | 2/2001 |
| JP | A-2001-217514 | 8/2001 |

* cited by examiner

*Primary Examiner*—Andy Huynh
(74) *Attorney, Agent, or Firm*—Posz Law Group, PLC

(57) ABSTRACT

A circuit substrate includes a plurality of dielectric members and a plurality of wiring patterns. The plurality of wiring patterns are stacked on one another through the plurality of dielectric members. The plurality of dielectric members includes a mount dielectric member. A first wiring pattern of the plurality of wiring patterns is provided on a side of the mount dielectric member. A second wiring pattern of the plurality of wiring patterns is provided on an opposite side of the mount dielectric member. A first length is a length between a reinforcing medium of the mount dielectric member and the opposite side of the mount dielectric member in a thickness direction. A second length is a length between the reinforcing medium of the mount dielectric member and the side of the mount dielectric member in the thickness direction. The first length is smaller than the second length.

19 Claims, 4 Drawing Sheets

CIRCUIT SUBSTRATE AND MANUFACTURING METHOD THEREOF

CROSS REFERENCE TO RELATED APPLICATION

This application is based on and incorporates herein by reference Japanese Patent Application No. 2005-340773 filed on Nov. 25, 2005.

BACKGROUND OF THE INVENTION

1. Field of the Invention

The present invention relates to a circuit substrate, which includes a plurality of wiring patterns, and a manufacturing method of the circuit substrate. Here, each of the plurality of wiring patterns is stacked on another through a dielectric member and is electrically connected with one another.

2. Description of Related Art

Conventionally, Japanese Unexamined Patent Publication No. 2001-36253 discloses a circuit substrate, in which an influence of a generated stress is limited. Here the stress is generated due to a difference of coefficients of thermal expansion between the circuit substrate and an electric device mounted to the circuit substrate. FIG. 5 is a sectional view of a schematic structure of the circuit substrate disclosed in Japanese Unexamined Patent Publication No. 2001-36253.

The circuit substrate disclosed in Japanese Unexamined Patent Publication No. 2001-36253 includes a body substrate 100 and a film substrate 200. The body substrate 100 includes dielectric layers 110 made of a dielectric resin and body wiring patterns 120. The dielectric layers 110 and the body wiring patterns 120 are stacked on one anther. The film substrate 200 is joined to one side of the body substrate 100, and includes a film 220, a mount wiring pattern 240, via holes 230, and a low elastic resin layer 210. The film 220 is made of a resin, such as polyimide. The mount wiring pattern 240 is formed on one side of the film 220 and an electric device is mounted on the mount wiring pattern 240. The via holes 230 electrically connect the body wiring pattern 120 and the mount wiring pattern 240. The low elastic resin layer 210 is formed between the body substrate 100 and the mount wiring pattern 240, and is made of a low elastic resin, which is less elastic than a dielectric layer 110 of the body substrate 100. Here, the low elastic resin includes a dispersed nitrile-butadiene rubber (NBR) thermoset modified epoxy resin sheet.

In the circuit substrate disclosed in Japanese Unexamined Patent Publication No. 2001-36253, the low elastic resin layer 210 (i.e., resin layer having a small modulus of elasticity) easily deforms according to the stress caused by the thermal expansion of the mounted electric device and of the circuit substrate. Thus, the stress generated due to the difference of the coefficients of the thermal expansion between the electric device and the circuit substrate can be absorbed or mitigated.

However, in the circuit substrate disclosed in Japanese Unexamined Patent Publication No. 2001-36253, a resin sheet is formed (provided) between the mount wiring pattern 240 and the body wiring pattern 120. Thus, when a crack is formed on a surface of the circuit substrate due to thermal stress and the like, the mount wiring pattern 240 may be electrically connected with the body wiring pattern 120. As a result, a dielectric property of the film substrate 200 may deteriorate, and breaking of the body wiring pattern 120 may occur.

Also, the circuit substrate disclosed in Japanese Unexamined Patent Publication No. 2001-36253 can be manufactured only through a build up method. As a result, even when a circuit substrate does not require minute patterning, a manufacturing process thereof tends to be complex.

SUMMARY OF THE INVENTION

The present invention is made in view of the above disadvantages. Thus, it is an objective of the present invention to address at least one of the above disadvantages.

To achieve the objective of the present invention, there is provided a circuit substrate, which includes a plurality of dielectric members and a plurality of wiring patterns. Each of the plurality of dielectric members has a reinforcing medium and a dielectric resin. The plurality of wiring patterns are stacked on one another through the plurality of dielectric members. The plurality of dielectric members includes a mount dielectric member. The plurality of wiring patterns includes a first wiring pattern and a second wiring pattern. The first wiring pattern is provided on a side of the mount dielectric member, and an electric device is to be mounted on the first wiring pattern. The second wiring pattern is provided on an opposite side of the mount dielectric member opposite from the first wiring pattern. A first length is a length between the reinforcing medium of the mount dielectric member and the opposite side of the mount dielectric member in a thickness direction of the circuit substrate. A second length is a length between the reinforcing medium of the mount dielectric member and the side of the mount dielectric member in the thickness direction. The first length is smaller than the second length.

To achieve the objective of the present invention, there is also provided a manufacturing method for manufacturing a circuit substrate. In this method, a reinforcing substrate is stacked on a plurality of dielectric substrates. A resin substrate is stacked on the reinforcing substrate in a state, where an opposite side of the resin substrate faces the reinforcing substrate, the opposite side being opposite from a side of the resin substrate, on which a mount wiring pattern is formed. The plurality of dielectric substrates, the reinforcing substrate, and the resin substrate, which are stacked, are joined together. A through hole that extends through the plurality of dielectric substrates, the reinforcing substrate, and the resin substrate is formed after the joining of the plurality of dielectric substrates, the reinforcing substrate, and the resin substrate. An electrical connector is formed in the through hole, the electrical connector electrically connecting the mount wiring pattern and wiring patterns of the plurality of dielectric substrates.

To achieve the objective of the present invention, there is also provided a manufacturing method for manufacturing a circuit substrate. In the method, a base substrate and a reinforcing substrate are joined. A first via hole is formed in the reinforcing substrate after the joining of the base substrate and the reinforcing substrate. A first electrical connector is formed in the first via hole, the first electrical connector electrically connecting with a corresponding wiring pattern of the base substrate. A resin substrate and the reinforcing substrate are joined in a state, where an opposite side of the resin substrate faces the reinforcing substrate, the opposite side being opposite from a side of the resin substrate, on which a mount wiring pattern is formed. A second via hole is formed in the resin substrate after the joining of the resin substrate and the reinforcing substrate. A second electrical connector is formed in the second via hole, the second electrical connector electrically connecting the first electrical connector and the mount wiring pattern.

To achieve the objective of the present invention, there is also provided a manufacturing method for manufacturing a circuit substrate. In the method, a mount dielectric substrate is stacked on a plurality of dielectric substrates in a state, where an opposite side of the mount dielectric substrate faces the plurality of dielectric substrates, the opposite side being opposite from a side of the mount dielectric substrate, on which a mount wiring pattern is formed. The mount dielectric substrate and the plurality of dielectric substrate, which are stacked in the stacking of the mount dielectric substrate on the plurality of dielectric substrate, are joined. A through hole that extends through the plurality of dielectric substrates and the mount dielectric substrate is formed after the joining of the mount dielectric substrate and the plurality of dielectric substrate. An electrical connector is formed in the through hole, the electrical connector electrically connecting the mount wiring pattern and wiring patterns of the plurality of dielectric substrate.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF PREFERRED EMBODIMENTS

A preferred embodiment of the present invention will be described with reference to accompanying drawings.

Figure 1:
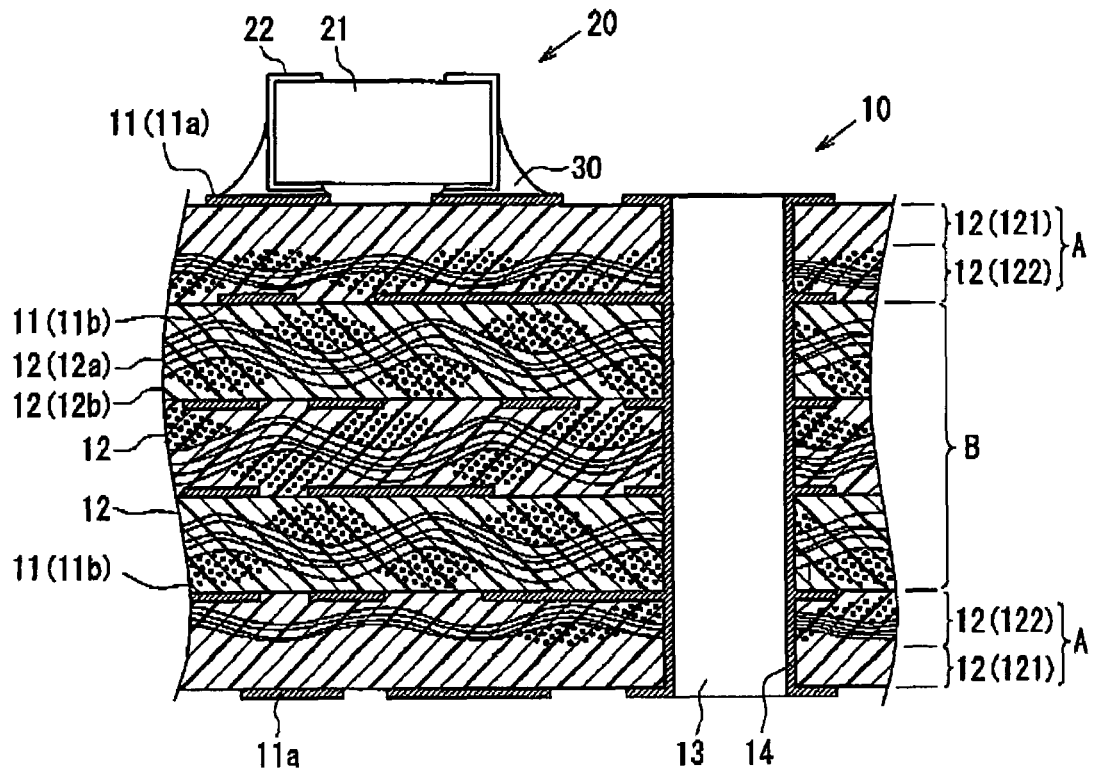
FIG. 1 is a sectional view of a schematic structure of a circuit substrate according to a preferred embodiment of the preset invention.

As shown in FIG. 1, an electric device 20 is mounted on a circuit substrate 10 of the present embodiment through a solder 30 (corresponding to an electrically connecting member of the present invention). The circuit substrate 10 includes wiring patterns 11, dielectric members (dielectric substrates) 12, through holes 13, and connectors 14.

The wiring patterns 11 include mount wiring patterns (first wiring patterns) 11a and opposite wiring patterns (second wiring patterns) 11b. Each of the mount wiring patterns 11a is formed on a surface of the circuit substrate 10. The electric device 20 is mounted on the mount wiring pattern 11a through the solder 30. Each of the opposite wiring patterns 11b opposes the corresponding mount wiring pattern 11a. That is, the opposite wiring pattern 11b is a closest one of the wiring patterns 11, being close to the mount wiring patterns 11a. Here, the wiring patterns 11 are stacked on one another through the corresponding dielectric member 12. Thus, in one embodiment, the opposite wiring pattern 11b is provided on an opposite face of the dielectric member 12 opposite from a face, on which the mount wiring pattern 11a is mounted.

The wiring patterns 11 are stacked on (layered) one another through the dielectric members 12, which include glass cloth 12a (corresponding to a reinforcing medium of the present invention), and a dielectric resin 12b. Then, the wiring pattern 11 of one layer is electrically connected with another wiring pattern 11 of another layer through the connector 14 formed in the through hole 13. Although the electric device 20 is mounted on only one side of the circuit substrate 10 in FIG. 1, another electric device 20 may be mounted on another mount wiring pattern 11a of another side of the circuit substrate 10.

The dielectric member 12 includes mount dielectric members (mount dielectric substrates) A and body dielectric members B. Each of the mount dielectric members A is held between the mount wiring pattern 11a and the opposite wiring pattern 11b. Also, the body dielectric members B serve as a body part of the circuit substrate 10.

The mount dielectric member A includes a resin part (resin substrate) 121 and a reinforcing part (reinforcing substrate) 122. The resin part 121 is a dielectric part made of only the dielectric resin 12b, such as an epoxy resin. In other words, the dielectric part made of only the dielectric resin 12b does not have the reinforcing medium, such as the glass cloth. The reinforcing part 122 is another dielectric part made by impregnating the glass cloth 12a with the dielectric resin 12b (e.g., the epoxy resin) for keeping the circuit substrate strong. In other words, the reinforcing part 122 is a prepreg (preimpregnation). Structured as above, the glass cloth 12a in the mount dielectric member A of the circuit substrate 10 is positioned toward (close to) the opposite wiring pattern 11b in a thickness direction of the circuit substrate 10. The above location definition of the glass cloth 12a will be described differently. A first length is a length between the glass cloth 12a and a first side of the mount dielectric member A in the thickness direction. Here, the opposite wiring pattern 11b is mounted on the first side. Also, a second length is a length between the glass cloth 12a and a second side of the dielectric member A in the thickness direction. Here, the mount wiring pattern 11a is mounted on the second side. The glass cloth 12a is positioned in the mount dielectric member A such that the first length is smaller than the second length. In one embodiment, the thickness direction is generally normal to the surface of the circuit substrate 10 (up-down direction in FIG. 1).

Similar to the above reinforcing part 122, the body dielectric member B is the dielectric part made by impregnating the glass cloth 12a with the dielectric resin 12b (e.g., the epoxy resin) for keeping the circuit substrate 10 strong.

The same material is used for each dielectric resin, which constitutes the dielectric member 12 (i.e., the resin part 121 and the reinforcing part 122 of the mount dielectric member A, and the body dielectric member B). Because the dielectric resins 12b of the mount dielectric member A and the body dielectric member B are made of the same material as above, detachment of one dielectric member 12 from another dielectric member 12 can be limited. That is, the detachment in the area including the dielectric member 12 and the corresponding wiring pattern 11 can be limited from occurring.

The electric device 20 mounted on the circuit substrate 10 includes an electric element 21 and electrodes 22. The electric device 20 is not limited to the above structure as long as the electric device 20 is mountable on the circuit substrate 10.

The reinforcing medium of the present embodiment will be described with reference to the glass cloth 12a. However, the present invention is not limited to this, and nonwoven cloth (e.g., aramid) may alternatively serve as the reinforcing medium.

A simulation result of an example of the above structured circuit substrate 10 analyzed using a finite element method (FEM) will be shown.

The circuit substrate 10 of the following specification is used in the FEM analysis. Each of the reinforcing part 122 and the body dielectric member B has a linear expansion coefficient of x=16 ppm, y=14 pm, and z=65 ppm, and Young's modulus of 21000 MPa. The resin part 121 has the linear expansion coefficient of x=y=50 ppm, and Young's modulus of 2100 MPa. The circuit substrate 10 has a total thickness of 1.2 mm and includes 3126 chip resistance (the electric device 20), which is mounted on the circuit substrate 10 through a lead free solder 30. In the present FEM analysis, a cumulative strain amplitude of the solder 30 is calculated in a state where the thermal stress is applied to the circuit substrate 10 by repeating the thermal cycle of −30° C. and 110° C. several times.

Figure 2:
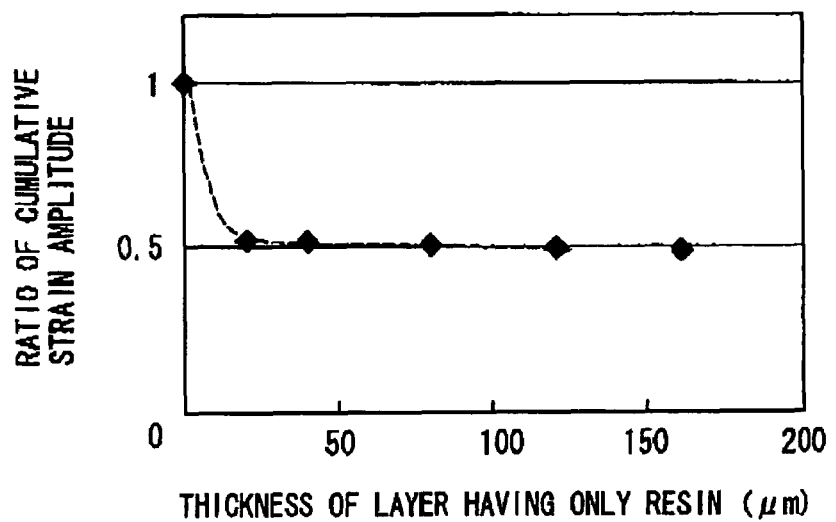
FIG. 2 is a chart showing an FEM analysis result of the circuit substrate according to the preferred embodiment of the present invention.

As shown in FIG. 2, it is markedly known that the cumulative strain of the solder 30 is reduced when the resin part 121 has the thickness of 25 μm or more. The present FEM analysis shows that the cumulative strain of the solder 30 can be reduced to half when the resin part 121 has the thickness of 25 μm or more.

In the present embodiment, the glass cloth 12a in the mount dielectric member A of the circuit substrate 10 is positioned toward (close to) the opposite wiring pattern 11b in the thickness direction of the circuit substrate 10. Thus, the cumulative strain of the solder 30 of the present embodiment can be lowered compared with a case where the resin part 121 has a thickness of 0 μ. In other words, the cumulative strain of the solder 30 of the present embodiment can be lowered compared with the case where a circuit substrate has only dielectric members, all of which are made by impregnating the glass cloth 12a with the dielectric resin 12b.

The glass cloth 12a in the mount dielectric member A of the circuit substrate 10 is positioned toward the opposite wiring pattern 11b in the thickness direction of the circuit substrate 10. In other words, in the mount dielectric member A, the reinforcing part 122 is positioned toward the opposite wiring pattern 11b and the resin part 121, which is made of only the resin, is positioned toward the mount wiring pattern 11a. Thus, a portion toward the mount wiring pattern 11a in the mount dielectric member A has less elasticity (smaller modulus of elasticity) than the reinforcing part 122 and the body dielectric member B. Therefore, even when the stress is generated due to the difference of the coefficients of thermal expansion between the circuit substrate 10 and the electric device 20, the deformation of the resin part 121 made of the resin can mitigate the stress. Also, because the resin part 121 mitigates the stress, the stress applied to the solder 30 can be reduced. As a result, connection life of the solder 30 can be extended (i.e., the solder 30 can maintain connection longer).

Also, a crack may be generated on the surface of the circuit substrate 10 due to the thermal cycle. However, the circuit substrate 10 of the present embodiment includes the reinforcing part 122, which is positioned toward the opposite wiring pattern 11b in the mount dielectric member A. Thus, even when the crack is generated on the surface of the circuit substrate 10, the glass cloth 12a limits the crack from reaching the opposite wiring pattern 11b. Therefore, deterioration of a dielectric property of the mount dielectric member A and breaking of the opposite wiring pattern 11b can be limited.

Here, a manufacturing method of the circuit substrate 10 of the present embodiment will be described with reference to FIG. 3. In the present embodiment, the circuit substrate 10 will be described as a double-sided mount substrate, in which the electric devices 20 are mounted on both sides of the circuit substrate 10. However, the present invention is not limited to the above structure, and the circuit substrate 10 may be a one-sided mount substrate, in which the electric device is mounted only one side of the circuit substrate.

Figure 3A:
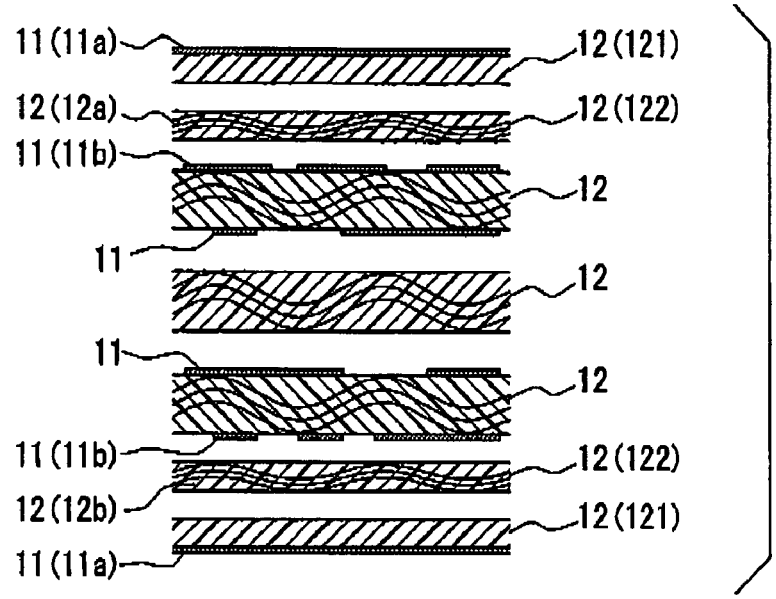
FIG. 3A is a sectional view showing a step of a manufacturing process for manufacturing the circuit substrate according to the preferred embodiment of the present invention.

First, as shown in FIG. 3A, the resin substrate (resin part) 121, the reinforcing substrate (reinforcing part) 122, a first dielectric substrate (the dielectric substrate 12 with the wiring patterns 11), and a second dielectric substrate (the dielectric substrate 12 without the wiring patterns 11) are prepared. Here, the resin substrate 121 is made only of the dielectric resin 12b, but of the reinforcing medium, such as the glass cloth 12a. Also, the resin substrate 121 has an electrically conductive member (e.g., copper) formed on the surface thereof. The reinforcing substrate 122 is made by impregnating the glass cloth 12a with the dielectric resin 12b (e.g., epoxy resin). The first dielectric substrate is made by impregnating the glass cloth 12a with the dielectric resin 12b (e.g., epoxy resin). Also, the first dielectric substrate has the electrically conductive members (e.g., copper) formed on the surface thereof. Here, the electrically conductive members serve as the wiring patterns 11. The second dielectric member is made by impregnating the glass cloth 12a with the dielectric resin 12b (e,g., epoxy resin).

As shown in FIG. 3A, the dielectric substrates 12, which are positioned inside the circuit substrate 10, have the wiring patterns 11 formed on the surfaces thereof. The wiring patterns 11 are formed by patterning the electrically conductive members, which is formed on the surface of the dielectric substrate 12, through etching. Here, the dielectric substrates 12, which are positioned inside the circuit substrate 10, may be the first dielectric substrates. Alternatively, the dielectric substrate 12, which are positioned inside the circuit substrate 10, may be the first dielectric substrates and the second dielectric substrates.

Figure 3B:
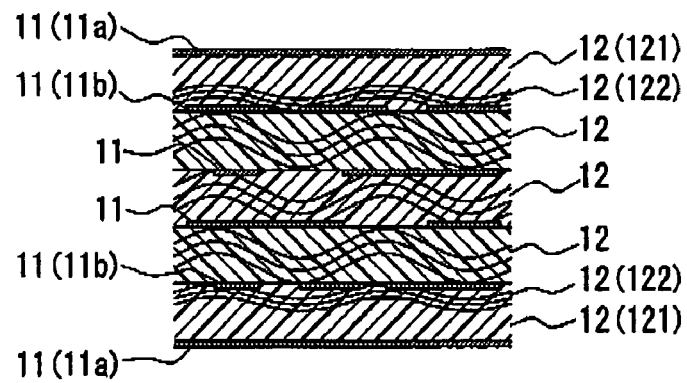
FIG. 3B is a sectional view showing another step of the manufacturing process for manufacturing the circuit substrate according to the preferred embodiment of the present invention.

As shown in FIG. 3B, the resin substrate 121, the reinforcing substrate 122, the dielectric substrate 12, the reinforcing substrate 122, and the resin substrate 121 are layered (stacked on one another). The layered substrates (i.e., the resin substrate 121, the reinforcing substrate 122, the dielectric substrate 12, the reinforcing substrate 122, and the resin substrate 121) are heated and compressed in a vacuum for bonding. In the present embodiment, the same material is used for each dielectric resin of the dielectric substrate 12 (i.e., the resin part 121 and the reinforcing part 122 of the mount dielectric member A, and the body dielectric member B). Thus, when the layered substrates are bonded, the layered substrates can be bonded all together without adjusting (e.g., generally equalizing) the linear expansion coefficients among the layered substrates. Thus, a labor hour in the manufacturing process can be reduced.

Figure 3C:
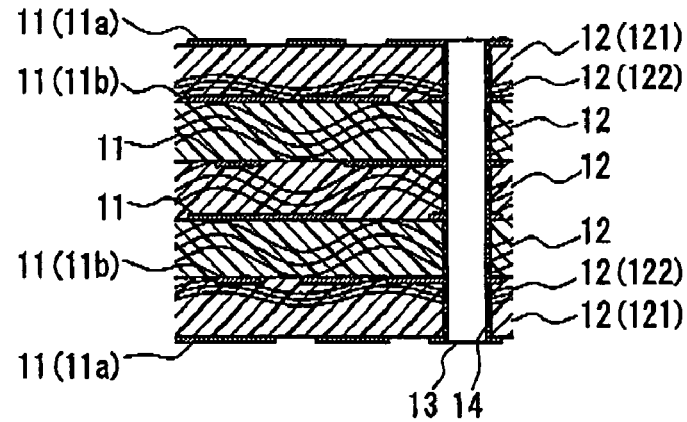
FIG. 3C is a sectional view showing another step of the manufacturing process for manufacturing the circuit substrate according to the preferred embodiment of the present invention.

Next, as shown in FIG. 3C, a through hole 13 is formed in the bonded layered dielectric substrates 12. Copper plating is applied to the through hole 13 to form a connector 14 such that the wiring patterns 11 are electrically connected with each other. Further, the mount wiring patterns 11a are formed by patterning the electrically conductive members, which are formed on the resin substrates 121, through etching.

As discussed above, firstly, the substrates (e.g., the resin substrates 121, the reinforcing substrates 122) are all together layered and bonded. Then, the through hole 13 is formed together on the bonded layered substrates, and the copper planting is applied to the through hole 13 such that the wiring patterns 11 are electrically connected with each other. Therefore, the circuit substrate 10, in which the glass cloth 12a of the mount dielectric member A is positioned toward the opposite wiring pattern 11b in the thickness direction, can be easily manufactured.

A modified embodiment will be described. As the modified embodiment, the circuit substrate 10 of the present embodiment may be formed using a build up method. FIGS. 4A to 4D are sectional views showing steps of the manufacturing process for manufacturing the circuit substrate according to the modified embodiment of the present invention.

Figure 4A:
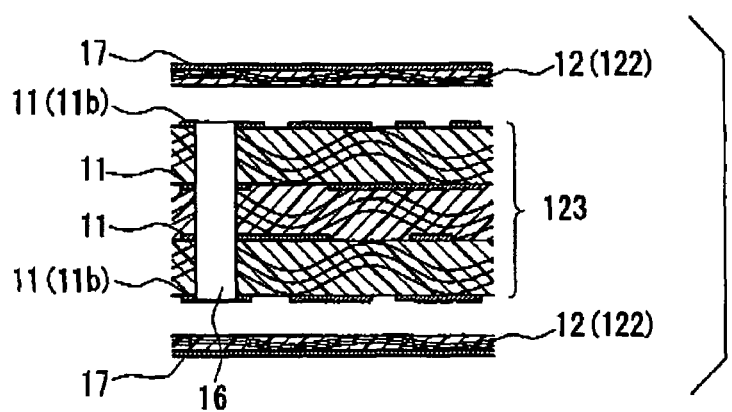
FIG. 4A is a sectional view showing a step of a manufacturing process for manufacturing a circuit substrate according to a modified embodiment of the present invention.

Firstly, as shown in FIG. 4A, the reinforcing substrates 122 and a core (base substrate) 123 are prepared. Here, the reinforcing substrate 122 is made by impregnating the glass cloth 12a with the dielectric resin 12b (e.g., epoxy resin) and by forming an interlayer-connecting pattern 17 on the surface of the reinforcing substrate 122. The core 123 is made by impregnating the glass cloth 12a with the dielectric resin 12b and by layering four wiring patterns 11. In one embodiment, the four wiring patterns 11 are layered (stacked) through the above made dielectric substrates. The core 123 includes a through hole, which is made by boring a hole using a drill and by applying copper plating to the hole. Therefore, the wiring patterns 11 of the core 123 are electrically connected with each other through the through hole. In some cases, the through hole is filled with an electrically conductive paste 16.

Figure 4B:
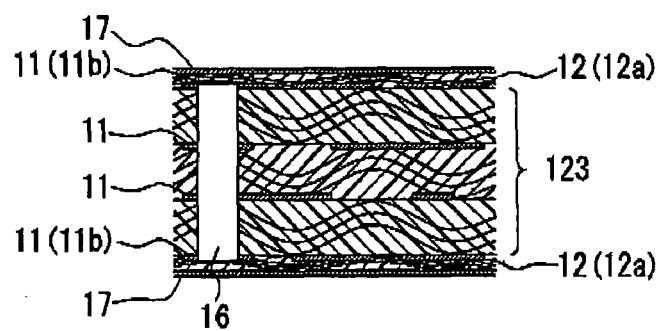
FIG. 4B is a sectional view showing another step of the manufacturing process for manufacturing the circuit substrate according to the modified embodiment of the present invention.

Next, as shown in FIG. 4B, the core 123 and the reinforcing substrate 122 are heated and compressed in the vacuum for bonding.

Figure 4C:
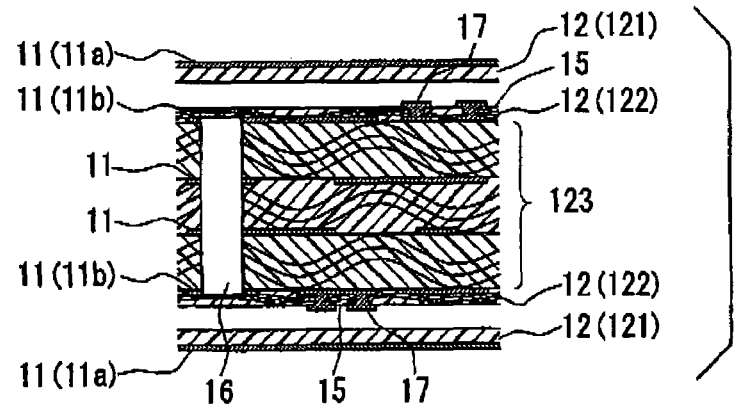
FIG. 4C is a sectional view showing another step of the manufacturing process for manufacturing the circuit substrate according to the modified embodiment of the present invention.

Next, as shown in FIG. 4C, pattern formation and etching are performed to remove the corresponding electrically conductive member, which corresponds to via positions of the reinforcing substrate 122. Via holes are formed on the corresponding via positions using a laser and the copper plating is applied. Other part of the electrically conductive members other than the via holes is removed by pattern formation and the etching. Laser vias are formed as above, and another laser via is formed in another dielectric member in a downstream process correspondingly to the corresponding laser via. Therefore, when the copper plating does not planarize (polish) the recess of the via hole, the via hole may be filled with a connector 15 made of electrically conductive paste.

Further, the resin substrate 121 is prepared. The resin substrate 121 is made only of the dielectric resin 12b, but of the reinforcing medium, such as the glass cloth 12a. Also, the resin substrate 121 has the electrically conductive member (e.g., copper) formed on the surface thereof.

Figure 4D:
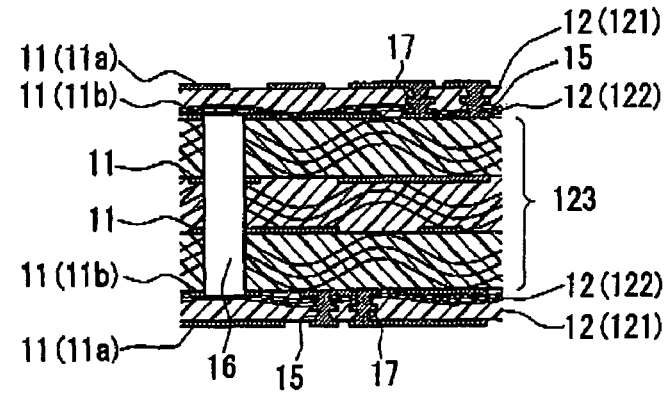
FIG. 4D is a sectional view showing another step of the manufacturing process for manufacturing the circuit substrate according to the modified embodiment of the present invention.
Figure 5:
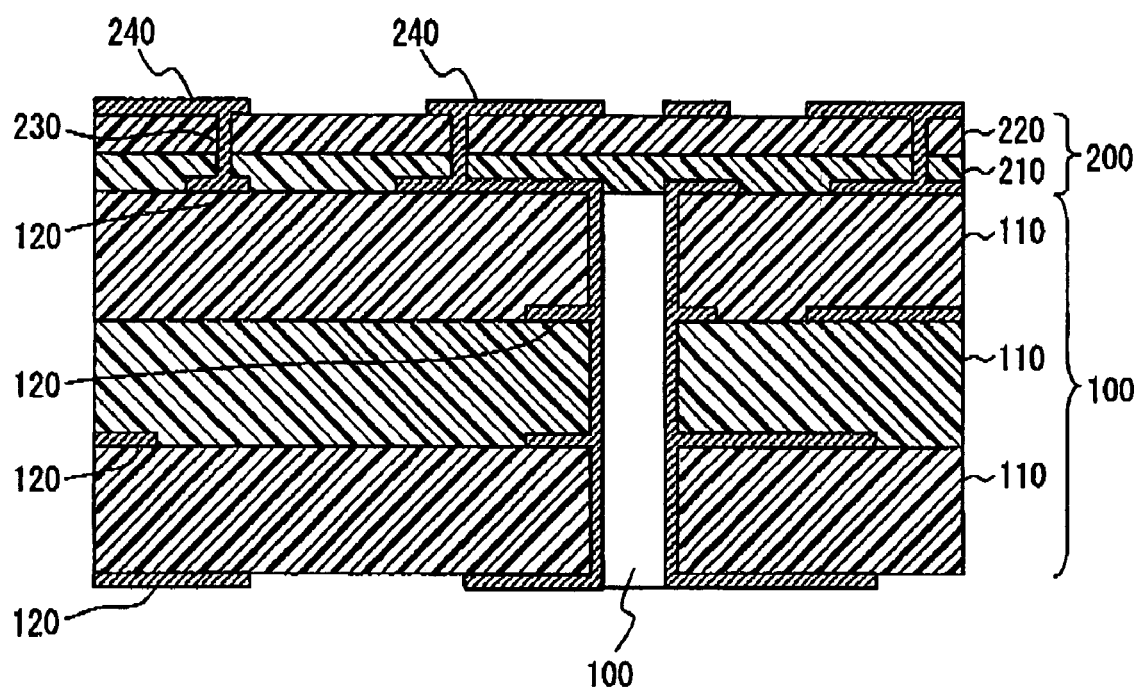
FIG. 5 is a sectional view of a schematic structure of a conventional circuit substrate.

Next, as shown in FIG. 4D, the resin substrate 121 is layered on the reinforcing substrate 122, and the resin substrate 121 and the reinforcing substrate 122 are heated and compressed in the vacuum for bonding. Then, via holes are formed on corresponding positions, which correspond to the connector 15 of the resin substrates 121, using the laser, and the copper plating is applied thereto. When the copper plating does not planarize (polish) the recess of the via hole, the via hole may be filled with the connector 15 made of the electrically conductive paste. Further, the electrically conductive member formed on the surface of the resin substrate 121 is patterned through the pattern formation and the etching, the mount wiring pattern 11a is formed.

As above, the circuit substrate 10 of the present embodiment can be also manufactured through the build up method. Therefore, the mount wiring patterns 11a and the opposite wiring patterns 11b can be electrically connected through minute via holes, which are bored using the laser. As a result, a minute land can be formed and thus, an electric device, such as a fine-pitch ball grid array (BGA), can be effectively positioned and mounted.

Also, when the circuit substrate 10 of the present embodiment requires minute machining, the circuit substrate 10 is manufactured by the build up method. When the circuit substrate 10 does not require the minute machining, the circuit substrate 10 is manufactured by layering the dielectric substrates 12 together. Thus, the circuit substrate 10 can be manufactured by suitable different methods for different requirements.

In the present embodiment, when the mount dielectric member A is manufactured, the resin substrate 121 and the reinforcing substrate 122 are bonded. However, the present invention is not limited to this. The mount dielectric substrate A may be made of the glass cloth 12a and the dielectric resin 12b, and the glass cloth 12a is positioned away from the mount wiring patterns 11a in the thickness direction.

In this case, the mount dielectric substrate A is layered and joined to the core 123, and the via holes are formed using the laser. Then, the copper plating is applied. The via hole may be filled with the connector 15 made of the electrically conductive paste. Therefore, a process for layering and joining the resin substrate 121 and the reinforcing substrate 122 is not required. As a result, the circuit substrate 10 can be more easily manufactured.

The present embodiment is described with an example, in which the same material is used for the dielectric resin 12b of the dielectric member 12. However, the present invention is not limited to this. For example, the dielectric resin 12b of the mount dielectric member A may have a smaller modulus of elasticity than other dielectric resin 12b of the dielectric member 12. As discussed above, by reducing (lowering) the modulus of elasticity of the dielectric resin 12b of the mount dielectric member A compared with that of the other dielectric resin 12b of the dielectric member 12, a degree of deformation of the mount dielectric member A due to the generated stress can be preferably made larger. Thus, in one embodiment, the generated stress can be more effectively mitigated by the deformation of the dielectric resin 12b of the mount dielectric member A. Here, the generated stress is generated because of the difference of the coefficients of thermal expansion between the circuit substrate 10 and the electric device 20. Also, the dielectric resin 12b of the resin part 121 of the mount dielectric member A may exclusively have the smaller modulus of elasticity than that of the other dielectric resin in the circuit substrate.

Additional advantages and modifications will readily occur to those skilled in the art. The invention in its broader terms is therefore not limited to the specific details, representative apparatus, and illustrative examples shown and described.

What is claimed is:
1. A circuit substrate comprising:
   a plurality of dielectric members, each of which has a reinforcing medium and a dielectric resin;
   a plurality of wiring patterns, which are stacked on one another through the plurality of dielectric members, wherein:

the plurality of dielectric members includes a mount dielectric member;
the plurality of wiring patterns includes:
- a first wiring pattern, which is provided on a side of the mount dielectric member, and on which an electric device is to be mounted; and
- a second wiring pattern, which is provided on an opposite side of the mount dielectric member opposite from the first wiring pattern;

a first length is a length between the reinforcing medium of the mount dielectric member and the opposite side of the mount dielectric member in a thickness direction of the circuit substrate;
a second length is a length between the reinforcing medium of the mount dielectric member and the side of the mount dielectric member in the thickness direction; and
the first length is smaller than the second length in an entirety of the mount dielectric member.

2. The circuit substrate according to claim 1, wherein: the dielectric resin of the mount dielectric member is made of an identical material with the dielectric resin of another one of the plurality of the dielectric members.

3. The circuit substrate according to claim 1, wherein: the dielectric resin of the mount dielectric member has a smaller modulus of elasticity than that of the dielectric resin of another one of the plurality of the dielectric members.

4. The circuit substrate according to claim 1, wherein: the mount dielectric member includes a reinforcing part, in which the reinforcing medium is positioned, and a resin part, which is made of the dielectric resin; and
the dielectric resin of the resin part has a smaller modulus of elasticity than the dielectric resin of another one of the plurality of the dielectric members.

5. The circuit substrate according to claim 1, wherein: the reinforcing medium includes glass cloth.

6. The circuit substrate according to claim 1, wherein: the reinforcing medium includes nonwoven cloth.

7. The circuit substrate according to claim 1, wherein: the reinforcing medium is glass cloth;
the mount dielectric member includes a reinforcing part, within which the glass cloth is entirely positioned, and a resin part, which is made only of the dielectric resin; and
the reinforcing part of the mount dielectric member is positioned toward the opposite side of the mount dielectric member; and
the resin part of the mount dielectric member is positioned toward the side of the mount dielectric member.

8. The circuit substrate according to claim 1, wherein: the mount dielectric member is a first mount dielectric member located on a first side of the circuit substrate in the thickness direction;
the plurality of dielectric members includes a second mount dielectric member that is located on a second side of the circuit substrate in the thickness direction, the second side being opposite from the first side;
the plurality of wiring patterns includes:
- a third wiring pattern, which is provided on an away side of the second mount dielectric member, the away side facing away from the first mount dielectric member in the thickness direction; and
- a fourth wiring pattern, which is provided on an opposite side of the second mount dielectric member opposite from the third wiring pattern;

a third length is a length between the reinforcing medium of the second mount dielectric member and the opposite side of the second mount dielectric member in the thickness direction of the circuit substrate;
a fourth length is a length between the reinforcing medium of the second mount dielectric member and the away side of the second mount dielectric member in the thickness direction; and
the third length is smaller than the fourth length in an entirety of the second mount dielectric member.

9. The circuit substrate according to claim 8, wherein: the fourth length is equal to or greater than 25 μm in the entirety of the second mount dielectric member.

10. The circuit substrate according to claim 1, wherein: the second length is equal to or greater than 25 μm in the entirety of the mount dielectric member.

11. A circuit substrate comprising:
a plurality of dielectric members, each of which has a reinforcing medium and a dielectric resin;
a plurality of wiring patterns, which are stacked on one another through the plurality of dielectric members, wherein:
the plurality of dielectric members includes a mount dielectric member;
the plurality of wiring patterns includes:
- a first wiring pattern, which is provided on a side of the mount dielectric member, and on which an electric device is to be mounted; and
- a second wiring pattern, which is provided on an opposite side of the mount dielectric member opposite from the first wiring pattern; and the reinforcing medium of the mount dielectric member is located closer to the second wiring pattern than to the first wiring pattern in an entirety of the mount dielectric member.

12. The circuit substrate according to claim 11, wherein: the reinforcing medium is glass clot;
the mount dielectric member includes a reinforcing part, within which the glass cloth is entirely positioned, and a resin part, which is made only of the dielectric resin; and
the reinforcing part of the mount dielectric member is positioned toward the opposite side of the mount dielectric member; and
the resin part of the mount dielectric member is positioned toward the side of the mount dielectric member.

13. The circuit substrate according to claim 11, wherein: the mount dielectric member is a first mount dielectric member located on a first side of the circuit substrate in a thickness direction;
the plurality of dielectric members includes a second mount dielectric member that is located on a second side of the circuit substrate in the thickness direction, the second side being opposite from the first side;
the plurality of wiring patterns includes:
- a third wiring pattern, which is provided on an away side of the second mount dielectric member, the away side facing away from the first mount dielectric member in the thickness direction; and
- a fourth wiring pattern, which is provided on an opposite side of the second mount dielectric member opposite from the third wiring pattern;

the reinforcing medium of the second dielectric member is located closer to the fourth wiring pattern than to the third wiring pattern in an entirety of the second mount dielectric member.

14. The circuit substrate according to claim 13, wherein: the reinforcing medium of the second dielectric member is located away from the away side of the second dielectric member by a dimension of equal to or greater than 25 μm in the entirety of the second mount dielectric member.

15. The circuit substrate according to claim 11, wherein:
the reinforcing medium of the mount dielectric member is located away from the side of the mount dielectric member by a dimension of equal to or greater than 25 μm in the entirety of the mount dielectric member.

16. A circuit substrate comprising:
a plurality of dielectric members, each of which has a reinforcing medium and a dielectric resin; and
a plurality of wiring patterns, which are stacked on one another though the plurality of dielectric members, wherein:
the plurality of dielectric members includes a mount dielectric member; the plurality of wiring patterns includes:
  a first wiring pattern, which is provided on a side of the mount dielectric member, and on which an electric device is to be mounted; and
  a second wiring pattern, which is provided on an opposite side of the mount dielectric member opposite from the first wiring pattern;
the mount dielectric member includes a first half part, within which the reinforcing medium is entirely located, on the opposite side of the mount dielectric member; and
the mount dielectric member includes a second half part, which is made only of the dielectric resin, on the side of the mount dielectric member.

17. The circuit substrate according to claim 16, wherein:
the mount dielectric member is a first mount dielectric member located on a first side of the circuit substrate in a thickness direction;
the plurality of dielectric members includes a second mount dielectric member that is located on a second side of the circuit substrate in the thickness direction, the second side being opposite from the first side;
the plurality of wiring patterns includes:
  a third wiring pattern, which is provided on an away side of the second mount dielectric member, the away side facing away from the first mount dielectric member in the thickness direction; and
  a fourth wiring pattern, which is provided on an opposite side of the second mount dielectric member opposite from the third wiring pattern;
the second mount dielectric member includes a first half part, within which the reinforcing medium is entirely located, on the opposite side of the second mount dielectric member; and
the second mount dielectric member includes a second half part, which is made only of the dielectric resin, on the away-side of the second mount dielectric member.

18. The circuit substrate according to claim 17, wherein:
the second half part of the second mount dielectric member has a thickness of equal to or greater than 25 μm in a thickness direction of the circuit substrate in the entirety of the second mount dielectric member.

19. The circuit substrate according to claim 16, wherein:
the second half part of the mount dielectric member has a thickness of equal to or greater than 25 μm in a thickness direction of the circuit substrate in the entirety of the mount dielectric member.

* * * * *